United States Patent [19]
Haake

[11] Patent Number: 5,952,836
[45] Date of Patent: Sep. 14, 1999

[54] DEVICE AND METHOD FOR DETECTING WORKPIECE FRACTURES

[75] Inventor: John M. Haake, St. Charles, Mo.

[73] Assignee: McDonnell Douglas Corporation, St. Louis, Mo.

[21] Appl. No.: 08/846,180

[22] Filed: Apr. 28, 1997

[51] Int. Cl.⁶ .................................................. G01R 27/08
[52] U.S. Cl. ............................ 324/718; 73/776; 73/799; 416/61; 416/134
[58] Field of Search .............................. 324/718; 73/799, 73/776, 789, 783; 416/61, 134

[56] References Cited

U.S. PATENT DOCUMENTS

| | | | |
|---|---|---|---|
| 4,026,660 | 5/1977 | Ueda | 416/61 |
| 4,106,332 | 8/1978 | McKeown | 416/61 |
| 4,255,974 | 3/1981 | Dufrane | 324/776 |
| 4,636,638 | 1/1987 | Huang et al. | 250/231 |
| 4,727,251 | 2/1988 | Blincow | 416/61 |
| 4,835,466 | 5/1989 | Maly | 324/718 |
| 5,184,516 | 2/1993 | Blazic | 73/799 |
| 5,205,710 | 4/1993 | Engels | 416/61 |
| 5,525,796 | 6/1996 | Haake | 250/227 |

FOREIGN PATENT DOCUMENTS

| | | | |
|---|---|---|---|
| 1739270-A1 | 6/1992 | Russian Federation | 324/718 |
| 2006846-C1 | 1/1994 | Russian Federation | 324/718 |

Primary Examiner—Josie Ballato
Assistant Examiner—Thomas Valone
Attorney, Agent, or Firm—Westerlund & Powell, P.C.; Robert A. Westerlund; Raymond H.J. Powell, Jr.

[57] ABSTRACT

A device for detecting fractures or corrosion in a workpiece having a non-conductive outer surface. A thin film layer of metallic material comprising a plurality of separate crack detection wires is bonded to the non-conductive surface of the workpiece. A top coating of protective material is applied to the thin film layer to protect the detection wires from abrasion and corrosion. When an electrical current is transmitted through the detection wires, a predictable resistivity pattern is viewable on a monitor. As a fracture propagates through the workpiece causing the crack detection wires to break one-by-one, the change in resistivity of the wires can be monitored and the existence and extent of any fracture or corrosion to the wires determined.

11 Claims, 5 Drawing Sheets

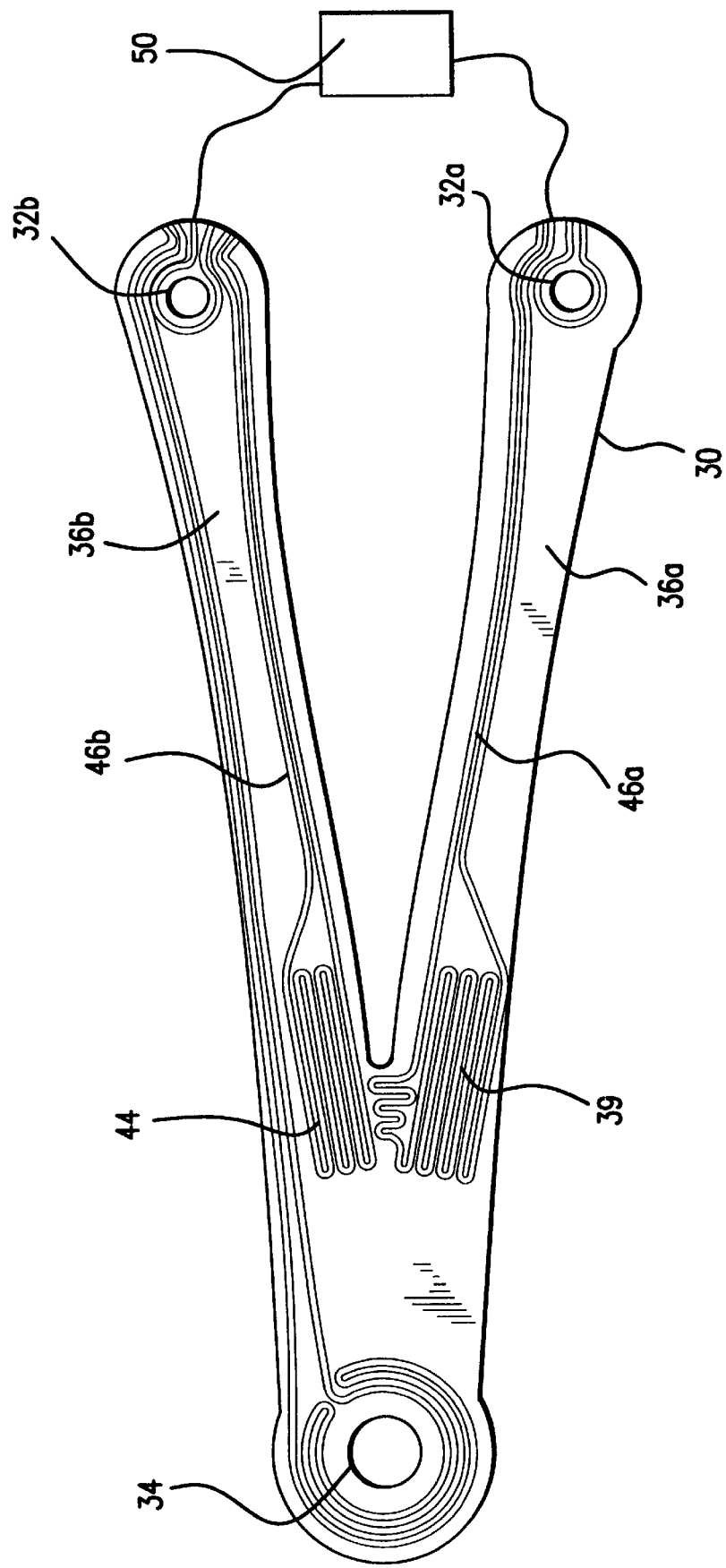

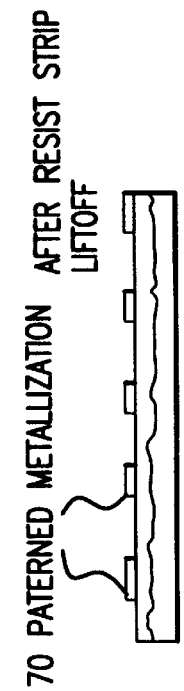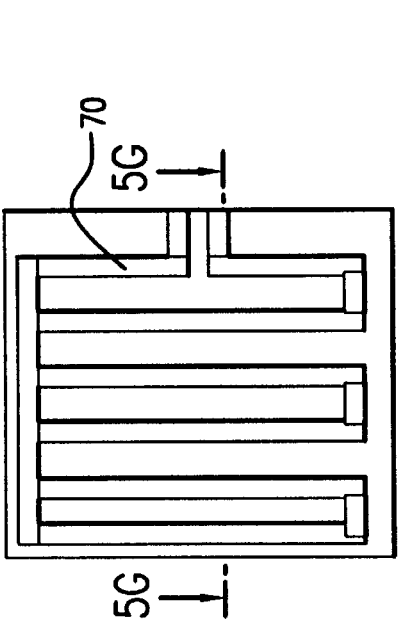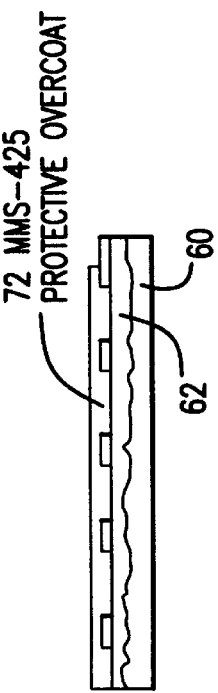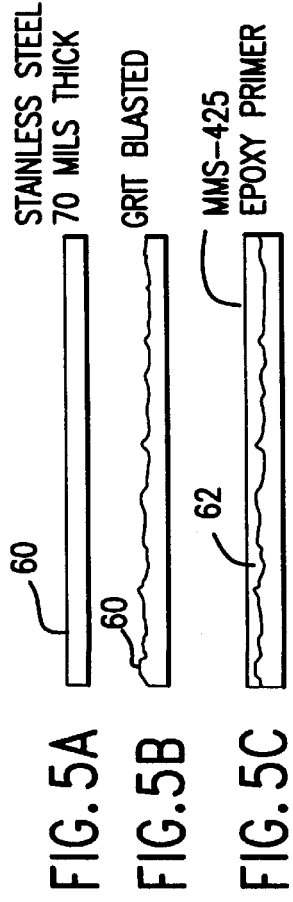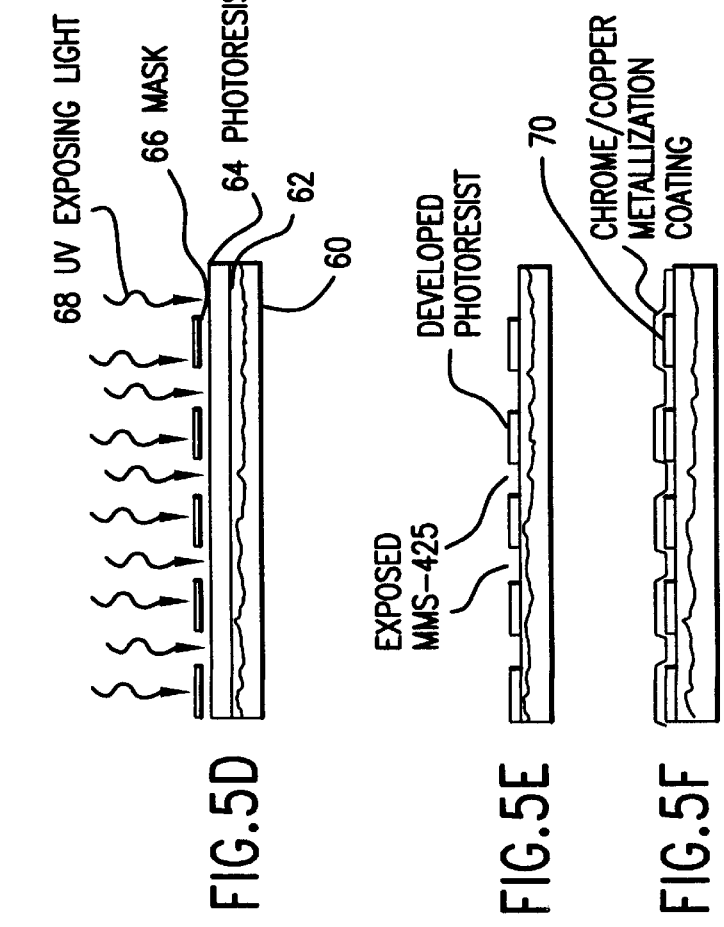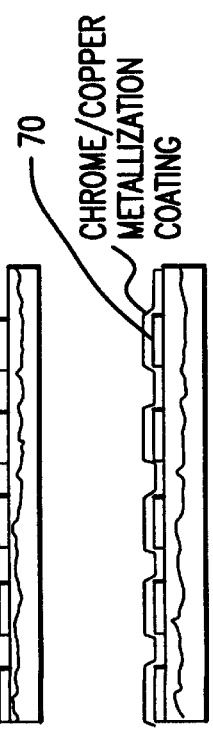

DEVICE AND METHOD FOR DETECTING WORKPIECE FRACTURES

BACKGROUND OF THE INVENTION

The present invention relates generally to a system for detecting fractures and corrosion in a workpiece. More particularly, the present invention relates to a unique device and method for monitoring the change in electrical properties in a thin film wiring layer, which changes are indicative of a fracture or corrosion of the wire caused by a fracture or degradation of the workpiece. The present invention allows maintenance personnel to easily diagnose and pinpoint fractures and corrosion in workpiece, thereby facilitating repair thereof.

Large and/or unusually shaped workpieces employed in the aerospace industry are typically visually inspected to detect cracks or fractures. Such inspections are usually performed at regular time intervals as part of a conventional time-based maintenance (TBM) program. Fractures which occur between inspection intervals can enlarge to a dangerous extent before detection. For example, fractures along the bulkhead or engine mounts of an aircraft may be repaired without hindering the performance of the aircraft if the fractures are detected while still relatively small. However, in order to visually inspect many sub-components, costly disassembly of the workpiece may be required. Because disassembly only occurs on a periodic basis, inspection often fails to uncover minor fractures before the workpiece suffers additional structural damage.

In order to overcome the problems associated with periodic visual inspection programs, fracture detecting systems have been devised to periodically inspect the surface of a workpiece to identify any fractures in the workpiece. For example, eddy current and radiography fracture detection methods have been utilized. In addition, ultrasonic fracture detection systems have been developed which typically only detect fractures in the line of sight between the ultrasonic transmitter/receiver. Each of these known systems require time-consuming, large area scanning by a highly trained technician which is time consuming and very costly. Furthermore, because these inspections are still performed on a periodic basis, fractures within workpieces of a complex shape may not be detected for a substantial time period, allowing them to enlarge to a size which can cause the workpiece to fail.

In order to overcome the problems associated with periodic inspection of a workpiece, an optical fiber fracture sensing system was developed and disclosed in U.S. Pat. No. 4,636,638 (hereinafter the "638 patent"). The sensing system disclosed in the '638 patent includes an optical fiber mounted on stress risers on the surface of the workpiece. The present inventor's own previous invention, disclosed in U.S. Pat. No 5,525,796 issued on Jun. 11, 1996, entitled FIBER OPTIC SENSING APPARATUS FOR DETECTING A FRACTURE IN A METALLIC WORKPIECE AND AN ASSOCIATED METHOD OF ATTACHING A FIBER OPTIC SENSING ELEMENT TO THE METALLIC WORKPIECE, assigned to the assignee of the present invention and herein incorporated by specific reference thereto, discloses an improved fracture detecting fiber optic element securely affixed to the workpiece with a metallic material, such as a metallic solder.

While optical fiber detection systems have the advantage of providing continuous monitoring of a workpiece, it has proven difficult to apply optical fiber detecting systems to workpieces having complicated or unusual shapes. For example, a helicopter rotor strap pack is a component having a complicated shape necessary for attaching the rotor blade to the rotor hub. The strap pack is normally contained within the blade pitch bearing housing and, in the AH-64 Apache helicopter, consists of 22, 20 mil thick laminates. Because of the shape of the strap pack, fiber optic inspection is not possible. As an alternative, an attempt has been made to use active and passive acoustic emission systems to "listen" for cracks. This method is almost physically impossible due to the fact that the strap pack is comprised of a plurality of laminated metallic strips with air gaps between each piece. High frequency sound waves are prevented from crossing the gaps due to the tremendous impedance mismatch. As a result, there is currently no way short of disassembly of the strap pack from detecting cracks on the various straps.

Based on the above and foregoing, it can be appreciated that there presently exists a need in the art for a system capable of continuously and/or periodically monitoring a complex workpiece such as a strap pack for fractures without the need for costly disassembly and visual inspection. The successful solution must be able to periodically or continuously monitor the workpiece for fractures without the need for disassembly.

SUMMARY OF THE INVENTION

The present invention encompasses a workpiece fracture detection system that includes a thin film wiring layer which is deposited onto an electrically insulated bottom coating (paint or primer) covering a metallic workpiece. A top coating in the form of a layer of paint or the like is deposited over the metallic, thin film wiring layer such that the wiring layer is sandwiched between the primer and paint layer which then functions to protect the thin film wiring layer. Alternatively, when the workpiece is formed of a non-conductive material such as plastic or ceramic, the thin film wiring layer can be directly applied to the surface of the workpiece and then covered with a protective top coating of paint or the like. When a crack or corrosion develops in the workpiece, the insulated bottom coating also cracks. The thin film wiring layer which is bonded to the insulating bottom coating also cracks, thus cracking the wire. By continuously monitoring the resistance or other electrical properties of the thin film wiring layer, it is possible to immediately determine whether and to what degree a fracture or corrosion has occurred in the wire and, hence, in the workpiece. Alternatively, periodic monitoring could be accomplished by a hand held ohmmeter or similar test apparatus.

The thin film wiring layer is preferably formed on a dielectric layer formed on the workpiece using a laser marking technique. Such laser marking techniques are well known and constitute no part of the present invention. A description of a preferred method of forming a metallic wiring pattern on a non-conductive substrate appears in LASER MARKING USING ORGANO-METALLIC FILMS, by D. R. Alexander appearing in Optics and Lasers Engineering 25(1996) on pages 55–70. According to this description, a thin film of metallic palladium (11) acetate in chloroform solution is coated onto a non-conductive, plastic substrate. The chloroform immediately evaporates, leaving behind a uniform thin film layer. The thin film layer is then irradiated in a predetermined pattern, and the irradiated portions decompose to give a continuous strand of palladium metal. While the strand is created to mark or identify the surface of a workpiece, the same technique, in effect, creates a metallic wire capable of transmitting electrical energy. It should be understood that while palladium is described in the article by D. R. Alexander, the present invention is not limited to the use of any particular material for the thin film layer. Rather, any electrically conductive material capable of being irradiated to create a thin strand or wire bonded to an electrically non-conductive surface is considered within the scope of the present invention.

As described in the article by D. R. Alexander, an Argon Ion Laser is employed to heat the palladium acetate, thus creating a metallic, thin film wiring layer. During operation, either the laser or the workpiece could undergo movement relative to one another such that the laser inscribes a continuous strand of wire of desired shape or patten on the workpiece.

In an alterative embodiment of the present invention, a laser chemical vapor deposition process could by employed as set forth in a paper entitled DIRECT WRITING USING LASER CHEMICAL VAPOR DEPOSITION published by North-Holland, New York N.Y., USA in 1983, ISBN 044400782 authored by S. D. Allen; A. B. Trigubo and R. Y. Jan. A further discussion of a metal film deposition procedure utilizing laser breakdown chemical vapor deposition appears in an article in the Journal of Materials Research (ISSN 0884-2914), vol.1, May–June 1986. P. 420–424, authored by T. R. Jervis and L. R. Newkirk.

According to the alternative embodiment, a non-conductive bottom coating of organic or ceramic material is applied to a stainless steel (or similar metallic) workpiece. The coating should have a high temperature-capability to withstand sliding frictional heating and abrasion wear, should be electrically insulating, and should have very low outgassing properties in vacuum, for optimum vacuum deposition. Coatings such as high temperature polyimide, e.g., EPO-TEK 391 produced by Epoxy Technology, Inc. 450° C., are prime candidates. 175° C. Cynate Ester resin thermoset epoxy (CIBA), epoxy primer has also proven successful, as has a glass coating. The specific selection criteria for the bottom coating is driven by the compatibility with the chemicals, temperature and pressures associated with the fabrication of the crack detection wires. When the workpiece is formed of aluminum, a sealed anodization coating serves as the insulating layer upon which the thin film wiring layer is deposited, thus obviating the need for a separate organic coating.

After the organic or ceramic bottom coating is applied to the workpiece, the thin film wiring layer is vacuum deposited thereon. The thin film wiring layer preferably consists of several layers of metal such as copper, gold, nickel, tin or other convenient conductive material. The base metal layer is the adhesion layer of the thin film wiring layer and preferably chemically combines with the organic bottom coating. The base metal layer can be formed from a variety of metals such as aluminum, titanium, tungsten or the like.

After the thin film wiring layer is deposited, an organic top coating can be applied to seal in the thin film and protect it from abrasion and corrosion while masking off a connection to the leads of the crack detection wire(s). The top coating can be formed of the same material as the bottom coating or other dielectric coating material that is resistant to the particular environment in which the part will be subjected to. The top coating can be, for example, formed of a polyimide or it could be formed of Teflon, Krylon, Nylon, Polyurethane or other suitable dielectric material.

In a further, alternate embodiment, the thin film wiring layer can be bonded to the workpiece using a conventional gas phase deposition process. Once again, the particular deposition process is not limiting to the present invention. A solid free form fabrication technique may be employed for three dimensional metal parts wherein a reactive gas is decomposed either pyrolitically (by heat) or photolytically (by photon interaction) to thereby form a conformal thin film wiring layer from the solid deposition products of the gas precursor in a pattern determined by a scanning laser. The laser beam provides a spatially confined reaction zone in which the reactant gase(es) dissociate on the substrate (the workpiece). The present invention utilizes this technology in a novel manner to deposit a thin film wiring layer over a complicated three dimensional part wherein prior use of this technology has been limited to the deposition of IC circuitry on a wafer.

After the thin film wiring layer has been deposited on the bottom coating, a focused laser beam can be guided over a three dimensional workpiece by a computer controlled position head. A continuous, metallic wire capable of transmitting electrical energy is created where the laser contacts the thin film, with the wiring layer directly bonding to the surface of the bottom coating or in the case of a non-conductive workpiece, with the outer surface of the workpiece itself. The wiring layer can be subsequently covered with a protective coating such as paint or epoxy paint in order to protect the wiring layer during subsequent manufacturing and assembly operations.

BRIEF DESCRIPTION OF THE DRAWINGS

These and various other features and advantages of the present invention will be readily understood with reference to the following detailed description read in conjunction with the attached drawings, in which:

FIG. 4 is a perspective view of the strap of FIG. 3 showing a thin film wiring layer formed thereon; and FIGS. 5A–5I show the steps followed in forming a thin film wiring layer on a metal workpiece.

DETAILED DESCRIPTION OF THE INVENTION

The present invention provides a unique detection system capable of detecting fractures and/or corrosion in large and/or unusually shaped workpieces. While the invention has particular utility in the aerospace field, the invention is not intended to be limited to any field or any particular type of workpiece.

Figure 1:
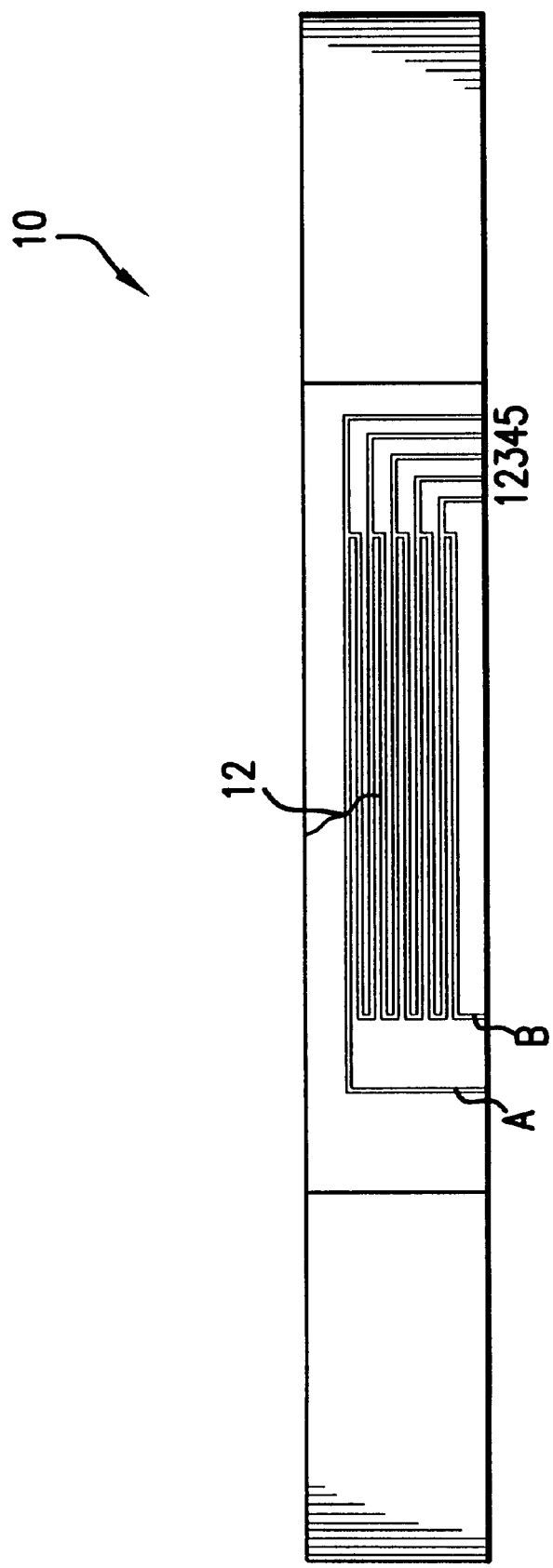
FIG. 1 is a top view of a basic workpiece fracture detection system constructed in accordance with the present invention.

FIG. 1 depicts a basic workpiece fracture detector system 10 constructed in accordance with a preferred embodiment of the present invention. The detector system 10 includes crack detection wires 1–5 and monitoring tabs A and B. The number of crack detection wires employed is a design choice and is not intended to be restricted to five, as illustrated. During operation (as will be explained in detail hereafter) an electrical current passes through the various crack detection wires 1–5 to create a predictable resistivity pattern for each wire. However as a crack or fracture 12 starts to propagate through a workpiece on which detector system 10 is mounted (not shown in FIG. 1), the individual crack detection wires 1–5 are each broken one at a time. As each crack detection wire starts to break, its resistivity is significantly altered. This change in resistivity of each wire can be detected even before a wire is completely broken. After an individual crack detection wire is completely broken, the electrical circuit through that wire becomes open.

Propagation of the fracture 12 through a workpiece can be detected by monitoring the change in resistivity of each of the crack detection wires as they are broken one-by-one. By simply monitoring the change in resistivity of the various crack detection wires, the changing position (i.e. enlargement) of the fracture is determined. The tabs A and B form a separate wire circuit that is useful in determining when a fracture exists anywhere within the detector system 10. If such a fracture enters the area covered by the detector system 10, the circuit formed by tabs A and B will be the first to change its resistivity. It has been determined that the resistivity increases for each crack detection wire 1–5, as well as that of tabs A and B, before the wire is completely broken, thereby opening the circuit. This increase in resistivity is due to the finite width of the wire across which the crack propagates. In effect, as a wire undergoes the actual breaking process, the portion of the wire available for carrying the electrical current is reduced, thereby causing the resistivity to increase. These changes in resistivity can be accurately monitored to determine at anytime exactly where a fracture is and the extent of the fracture on the workpiece.

Figure 2:
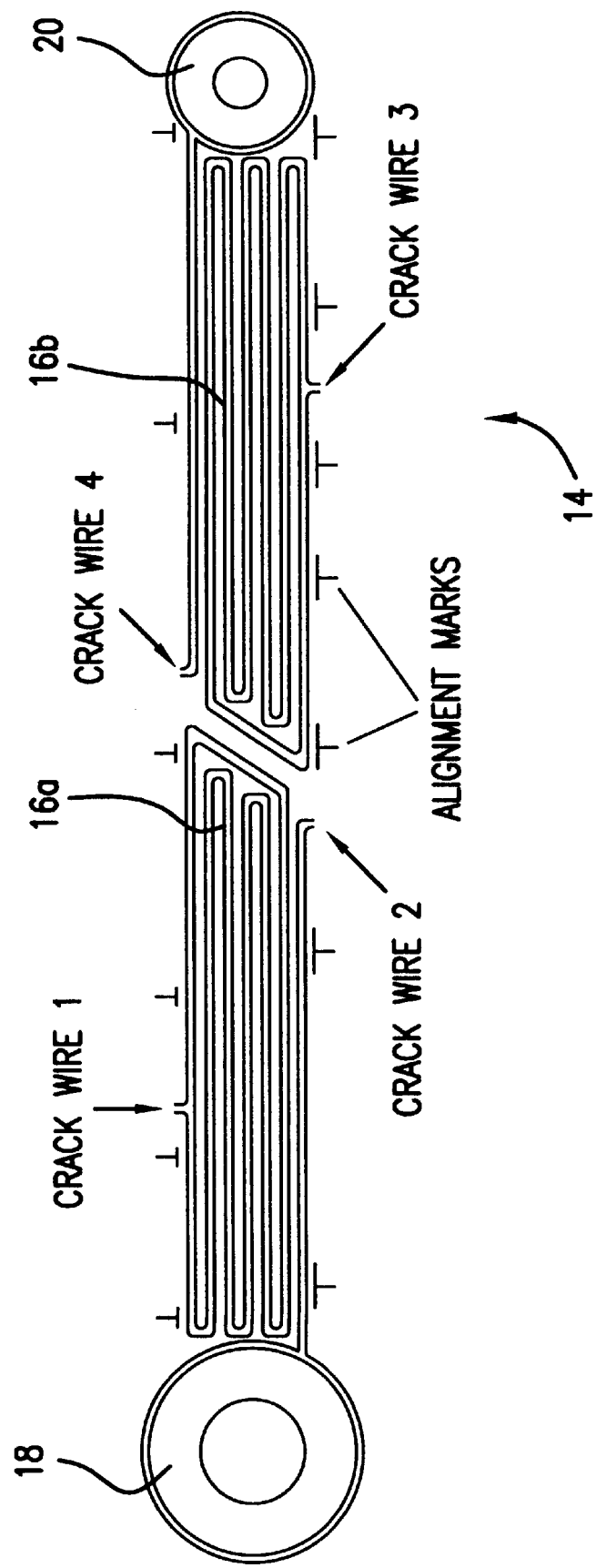
FIG. 2 is a mask for a positive photoresist used for patterning a wiring layer deposited on an elongated strap shaped workpiece.

FIG. 2 shows a photomask 14 used for patterning a thin film wiring layer formed on a workpiece such as a rotor strap pack. The photomask 14 has a complex or unusual shape including a pair of elongated central portions 16a and 16b and a pair of circular, hub end portions 18 and 20. Photomask 14 is conventionally referred to as a "dogbone" photomask for reasons which are believed self-explanatory. The thin film wiring layer is formed in accordance with the pattern of the photomask 14 by standard photolithographic processes. The crack detection wire patterns 2 and 3 overlap one another to assure that if a fracture begins to propagate across the elongated mid portion of the dogbone, one of the crack detection wires will break and detect the presence of the fracture. The individual wires created by photomask 14 each may be connected to a test monitor (not shown) in order that the workpiece can be continuously or periodically monitored to detect fractures.

For purposes of explanation only, the present invention will now be discussed in conjunction with detecting fractures that typically arise on a helicopter rotor blade strap pack. The strap pack is a part that actually holds the rotor blade onto the rotor hub unit. The strap pack is contained within a blade pitch bearing housing. On the Boeing H-46 helicopter, the strap pack is located inside a tube. The strap pack may consist of as many as 20 laminates each 20 mils thick for the McDonnell Douglas Apache helicopter and 50 laminates each 20 mils thick for the Boeing H-46 helicopter. This construction allows for almost unlimited pitch and roll movement of the rotor blade. The strap pack absorbs all of the torsional (twist) and tension loads and is under tremendous strain. When a strap pack fails in flight it is considered catastrophic and the helicopter is often lost. Currently the strap pack is manually inspected every 25 to 50 hours to detect fractures in the straps.

Figure 3:
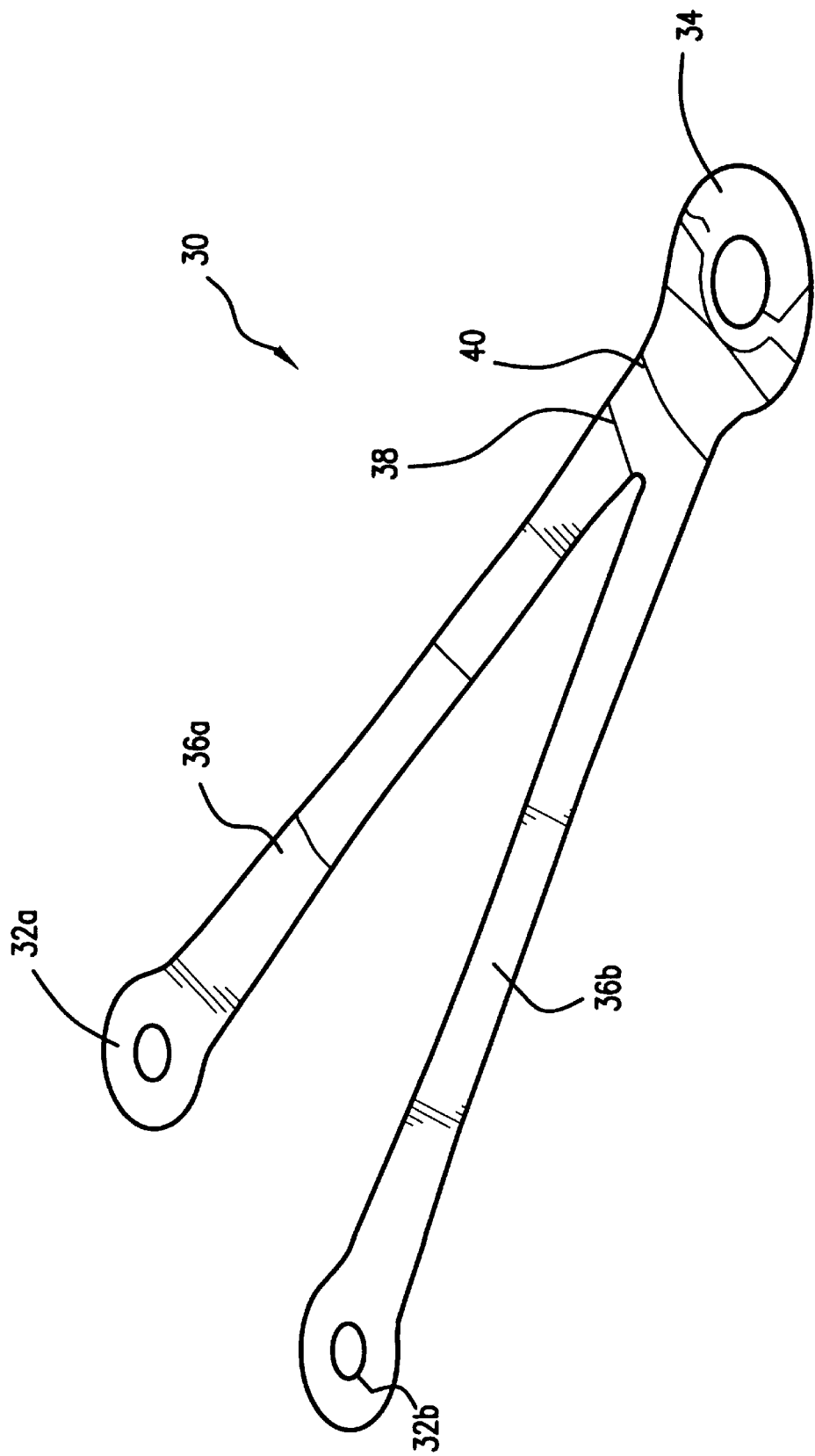
FIG. 3 is a perspective view of a helicopter strap showing the various failure modes.

Turning to FIG. 3, a conventional rotator strap 30 is shown in perspective. The various areas on the strap that are prone to developing fractures are identified. In particular, the inboard lugs 32a and 32b and outboard lug 34 have through openings that are high stress areas. Likewise, the legs 36a and 36b, apex 38, and throat portions 40 of strap 30 all have experienced fractures or cracks conventionally detected during visual inspection.

In order to continuously or periodically monitor each rotor strap 30, a workpiece fracture detection system 44 constructed in accordance with the present invention has been mounted on strap 30 as shown in FIG. 4. The detection system 44 includes elongated portions 46a and 46b each extending along one of the legs 36a and 36b between a respective one of the inboard lugs 32a and 32b and the outboard lug 34. Detection system 44 further includes a serpentine portion 39 overlapping the apex 38 and throat 40 of rotor strap 30. Finally, detection system 44 includes detection wires extending about each of the lug portions 32a, 32b and 34. In this configuration, detection system 44 covers each of the high risk areas on rotor strap 30 where fractures have been found during visual inspections.

During operation of detection system 44, the various crack detection wires are continuously or periodically monitored by an attached test monitor 50. Alternatively, detection system 44 can be periodically monitored by a hand-held ohmmeter, not shown. As a fracture propagates through rotor strap 30, the individual crack detection wires, as shown in FIG. 1, are broken one-by-one. This causes a change in resistivity pattern for detection system 44 that is viewable on test monitor 50. The individual rotor straps 30 can each be monitored continuously or periodically without costly disassembly of the strap pack. When cracks are detected in any of the straps, immediate replacement can be effected.

This same technique of utilizing crack detection wires for detecting workpiece fractures is not limited to use with a strap pack. Rather, any complex part that currently does not lend itself to fiber optic monitoring systems or requires costly disassembly prior to visual inspection could be periodically or even continuously monitored by the workpiece fracture detection system of the present invention. Such parts as the bulkhead or the engine mounts could have thin film wiring layers deposited thereon as part of the manufacturing process of the workpiece itself, similar to electroplating, anodizing or painting of the workpiece. For example, the thin film wiring layer could be made a part of the process of coating the metal part.

Preferably, the thin film wiring layer is applied by using a laser marking procedure as discussed in the D. R. Alexander article. When employed, palladium acetate produces a silver thin film wiring layer with a corrosion-resistant feature. The wiring layer has been found to show no apparent signs of oxidation even after 20 months of exposure. This means that even if a top coating protective layer has degraded, the thin film wiring layer may still be able to function as a crack detector.

The preferred marking technique described in the D. R. Alexander article is classified as a photothermal process depending greatly upon the substrate (e.g., bottom coating) material. The relationship between the different parameters, i.e., power, line width, speed and exposure time, are to be determined for the particular metallic film employed.

In an alternative embodiment, a thin film wiring layer is deposited on and bonded to the workpiece using any of several conventional deposition techniques. Reference is made to FIGS. 5a–5l, wherein a conventional thin film deposition procedure will be explained in some detail.

In FIG. 5A is shown a stainless steel workpiece 60. This workpiece could be a rotor strap for a conventional helicopter strap pack or any other metallic workpiece, such as an aircraft bulkhead or engine mount. Workpiece 60 first has its surface prepared by grit blasting, see FIG. 5B. Preferably, Aluminum Oxide 120–220 grit is applied at a pressure of 15–20 psi, at a distance of 4–12 inches from the workpiece.

Once the surface of workpiece 60 is sufficiently roughed up, a layer of epoxy primer 62 is applied, see FIG. 5C. The epoxy can be a chromate epoxy primer paint having a thickness of approx. 1 mil (25 microns).

Once the primer 62 is in place, a photoresist layer 64 is applied to the epoxy. Shipley 111 positive photoresist can be utilized, see FIG. 5D. The photoresist is baked on for 0.5–1.0 hours at 90–1000° C. A photo mask 66 is positioned on the photoresist and the surface of photoresist layer 64 is exposed for one hour to a mercury vapor or fluorescent lamp 68 (see FIG. 5D).

The photoresist is then developed, e.g., by applying Shipley 111 developer for 10–15 minutes, and the undeveloped portions are removed with water rinse at 20° C. (see FIG. 5E).

The next step is vacuum deposition of the thin film wiring layer as shown in FIG. 5F. This step yields an E-beam deposited metal layer 70 including a chrome base (e.g., 1000 Angstroms thick) and a copper conductive layer (e.g., 3000 Angstroms thick).

Once the vacuum deposition is accomplished, acetone is used to strip the residual photoresist mask and to lift off the excess chrome/copper metallization layer 70, as shown in cross section in FIG. 5G and in top view in FIG. 5H.

Finally, a top coat of polyimide or similar organic material 72 (1 mil thick) is applied to the thin film wiring layer for protection. Tape masks can be employed for access to the wire leads (see FIG. 5I).

The top coat 72 can be changed such that it is resistant to a particular environment in which the workpiece is exposed. While the top coat is preferably made of polyimide, it can be formed of Teflon, Krylon, Rayon, Nylon, Polyurethane or any material best suited for the environment in which the workpiece is used.

While laser chemical vapor deposition can be employed as discussed above, the laser marking technique eliminates the need for a photomask and is much more adaptable for use with large workpieces that cannot otherwise be readily handled.

The thin film wiring layer may also be deposited on the workpiece by known gas phase deposition techniques. The reactive gas is decomposed either pyrolitically (by heat) or photolytically (by photon interaction) to thereby deposit a conformal thin film wiring layer from the solid deposition products of the gas precursor, in a pattern determined by a scanning laser. The laser beam provides a spatially confined reaction zone in which the reactant gas(es) dissociate on the substrate, e.g., the complex aerospace part, leaving a solid metal residue. The thin film wiring layer can be subsequently covered with a protective top coating, e.g., paint, epoxy, in order to protect it during subsequent manufacturing and assembly operations.

The workpiece fracture detection wire can be vacuum or gas phase deposited in a continuous manner onto existing electrically insulated workpiece bottom coatings, e.g., paint or primer coatings on metal components. The thin film wiring layer can be sandwiched between the bottom coating and the top coating. As a fracture begins in the workpiece, the fracture will also propagate through the bottom coating. The thin film wiring layer which is embedded in the bottom coating will also crack, thus changing the electrical continuity, i.e., resistivity of the wire. By periodically or continuously monitoring the resistance or other electrical properties of the thin film wiring layer, one can ascertain the health of the structure at any time.

In a similar manner, degradation of the workpiece due to corrosion can be detected by monitoring the change in resistivity of the thin film wiring layer. As the workpiece undergoes corrosion, the thin film wiring layer also undergoes corrosion. This corrosion causes the resistivity of the affected wires to change. This change can be monitored and provide information as to where the corrosion has occurred and to what extent.

Although various embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A device for detecting fractures in a rotor strap of a helicopter, the rotor strap including first and second legs that form an acute angle having an apex, an inboard lug that joins the first and second legs inboard of the apex, and first and second outboard lugs disposed at distal ends of the first and second legs, repectively, wherein the device includes:

an electrically conductive wiring pattern formed on a major surface of the rotor strap, the wiring pattern including a first portion disposed about the inboard lug, a second portion adjacent the apex, a third portion extending along the first leg, a fourth portion extending along the second leg, a fifth portion disposed about the first outboard lug, and a sixth portion disposed about the second outboard lug; and, wherein the wiring pattern is formed in such a manner that a fracture in the rotor strap that intersects the wiring pattern will cause the wiring pattern to fracture, whereby the existence of a fracture in the rotor strap can be detected by monitoring one or more electrical characteristics of the wiring pattern.

2. The device as set forth in claim 1, further including a protective top coating formed on the wiring pattern to protect the wiring pattern from abrasion and corrosion.

3. The device as set forth in claim 1, wherein the major surface of the rotor strap is electrically non-conductive.

4. The device as set forth in claim 1, further including means for coupling the wiring pattern to a test instrument that is capable of monitoring at least one electrical characteristic of the wiring pattern.

5. The device as set forth in claim 1, wherein the rotor strap comprises an aluminum substrate and the major surface comprises an anodized surface of the aluminum substrate.

6. The device as set forth in claim 1, wherein the wiring pattern is comprised of a plurality of separate, spaced-apart wires.

7. The device as set forth in claim 1, wherein the second portion of the wiring pattern has a serpentine shape.

8. The device as set forth in claim 1, wherein each of the first, second, third, fourth, and fifth portions of the wiring pattern has a serpentine shape.

9. The device as set forth in claim 1, wherein the rotor strap comprises an aluminum substrate and the major surface comprises an electrically insulating layer formed on the aluminum substrate.

10. The device as set forth in claim 7, wherein the wiring pattern is comprised of a plurality of separate, spaced-apart wires.

11. The device as set forth in claim 8, wherein the wiring pattern is comprised of a plurality of separate, spaced-apart wires.

* * * * *